(12) United States Patent
Bronner et al.

(10) Patent No.: US 6,197,632 B1
(45) Date of Patent: Mar. 6, 2001

(54) METHOD FOR DUAL SIDEWALL OXIDATION IN HIGH DENSITY, HIGH PERFORMANCE DRAMS

(75) Inventors: Gary B. Bronner, Stormville; Rama Divakaruni, Middletown; Scott Halle, Hopewell Junction, all of NY (US); Dale W. Martin, Hyde Park, VT (US); Rajesh Rengarajan, Poughkeepsie; Mary E. Weybright, Pleasant Valley, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/440,776

(22) Filed: Nov. 16, 1999

(51) Int. Cl.[7] ................................................ H01L 21/8242
(52) U.S. Cl. ............................................................ 438/241
(58) Field of Search .................................... 438/241, 242, 438/240, 239, 800

(56) References Cited

U.S. PATENT DOCUMENTS

| | | |
|---|---|---|
| 4,776,922 * 10/1988 | Bhattacharyya et al. | 156/643 |
| 5,654,217 | 8/1997 | Yuan et al. . |
| 5,702,972 | 12/1997 | Tsai et al. . |
| 5,716,862 | 2/1998 | Ahmad et al. . |
| 5,766,992 | 6/1998 | Chou et al. . |
| 5,858,831 | 1/1999 | Sung . |
| 5,863,820 | 1/1999 | Huang . |

* cited by examiner

*Primary Examiner*—Chandra Chaudhari
*Assistant Examiner*—Craig Thompson
(74) *Attorney, Agent, or Firm*—Brinks Hofer Gilson & Lione

(57) ABSTRACT

This invention relates to integrated circuit product and processes. More particularly, the invention relates to high performance Dynamic Random Access Memory (DRAM) chips and processes for making such chips. An IC fabrication is provided, according to an aspect of the invention, including a silicon wafer, a DRAM array fabrication disposed on said silicon wafer having a first multitude of gate sidewall oxides, and a logic support device fabrication disposed on said wafer adjacent said DRAM array fabrication and having a second multitude of gate sidewall oxides, said first multitude of gate sidewall oxides being substantially thicker than said second multitude of gate sidewall oxides. Methods of making IC fabrications according to the invention are also provided.

12 Claims, 5 Drawing Sheets

METHOD FOR DUAL SIDEWALL OXIDATION IN HIGH DENSITY, HIGH PERFORMANCE DRAMS

BACKGROUND OF THE INVENTION

This invention relates to integrated circuit product and processes. More particularly, the invention relates to high performance Dynamic Random Access Memory (DRAM) chips and processes for making such chips.

Present processing of DRAM structures typically utilizes a thick sidewall oxidation after gate conductor etch. The sidewall oxidation improves array retention time by a stress relief anneal of the wafer, and also by developing a significant bird's beak at the transfer gate device edges. The extended oxidation reduces electric fields and potentially helps with ameliorating defect densities. Currently, extension and halo implants are then performed after the sidewall oxidation step, which necessitates increased energy implants and causes deeper junctions. The deeper junctions may not be desirable for all or some of the logic support devices that are often disposed adjacent to the DRAM array. Splitting sidewall oxidation into two steps does not provide an adequate solution since the dopants in the support logic devices are exposed to thermal processing of the DRAM array at elevated temperature, which causes diffusion of the dopants that still results in deep Junctions. Therefore, a process is desired wherein a DRAM array may be provided with a thick sidewall oxidation while providing for shallow junctions in some or all of the support logic devices.

SUMMARY OF THE INVENTION

According to an aspect of the invention, an IC fabrication structure is provided, comprising: a silicon wafer; a DRAM array fabrication disposed on the silicon wafer having a first multitude of gate sidewall oxides; and a logic support device fabrication disposed on the wafer adjacent the DRAM array fabrication and having a second multitude of gate sidewall oxides, the first multitude of gate sidewall oxides being substantially thicker than the second multitude of gate sidewall oxides.

According to a further aspect of the invention, an IC fabrication method is provided, comprising the steps of: forming a DRAM array fabrication on a silicon wafer having a first multitude of gate sidewall oxides; and, forming a logic support device fabrication on a silicon wafer having a second multitude of gate sidewall oxides, the first multitude of gate sidewall oxides being substantially thicker than the second multitude of gate sidewall oxides.

According to a still further aspect of the invention, an IC fabrication method is provided, comprising the steps of: forming a DRAM array fabrication on a silicon wafer having a first multitude of gate sidewall oxides and a logic support device fabrication having a second multitude of gate sidewall oxides adjacent to the DRAM array fabrication; subsequently doping the DRAM array fabrication; subsequently increasing thickness of the first multitude of gate sidewall oxides so that they are substantially thicker than the second multitude of gate sidewall oxides; and, subsequently doping the logic support device fabrication.

DETAILED DESCRIPTION OF THE INVENTION

Figure 1:
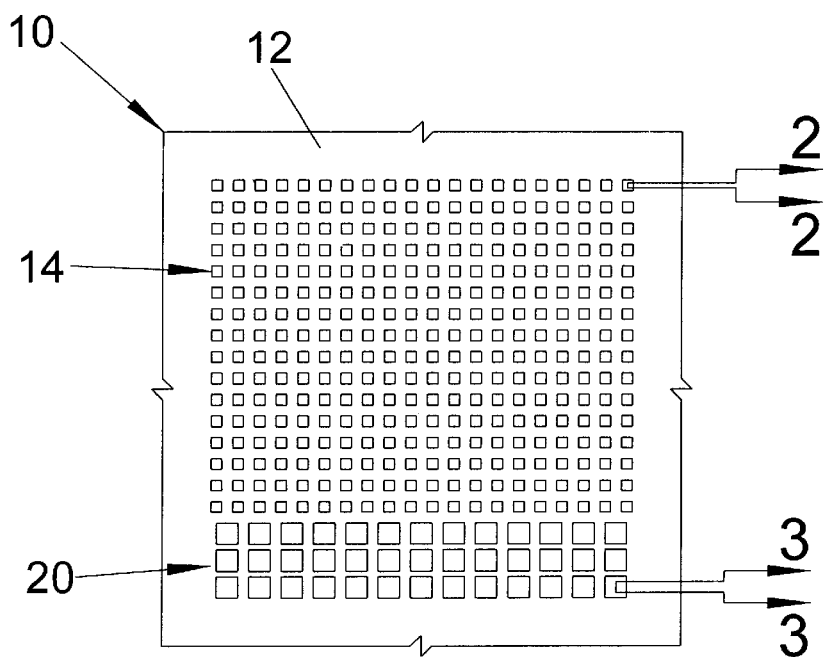
FIG. 1 presents a plan view of a portion of a silicon wafer having a DRAM array according to the invention.
Figure 2:
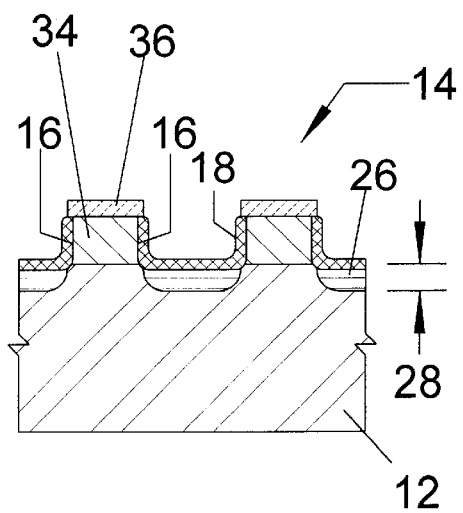
FIG. 2 presents an enlarged cross-sectional view of a portion of a DRAM array fabrication according to an aspect of the invention taken along line 2—2 of FIG. 1.
Figure 3:
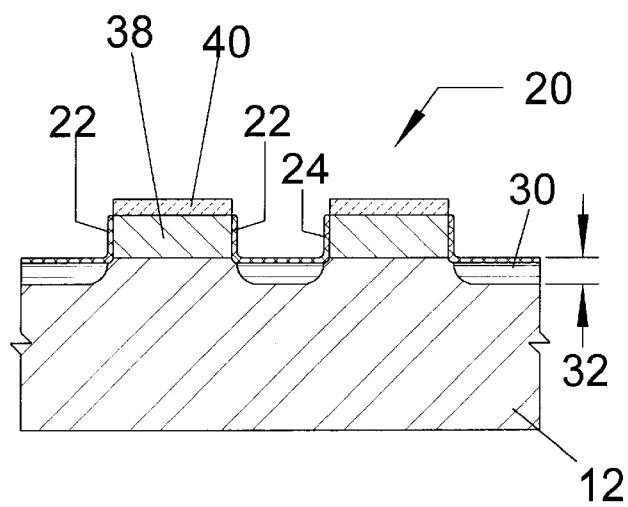
FIG. 3 presents an enlarged cross-sectional view of an adjacent portion of a logic support device fabrication according to an aspect of the invention taken along line 3—3 of FIG. 1.

Various aspects of the invention are presented in FIGS. 1-33, which are not drawn to scale, and wherein like components in the various views are numbered alike. Referring now specifically to FIG. 1, a top plan view of an Integrated Circuit ("IC") fabrication 10 is presented according to an aspect of the invention. The IC fabrication 10 comprises a silicon wafer 12 and a Dynamic Random Access Memory ("DRAM") array fabrication or fabrication area 14 disposed on the silicon wafer 12. An enlarged cross-sectional view taken along line 2—2 of FIG. 1 is presented in FIG. 2. As shown in FIG. 2, the DRAM array fabrication 14 comprises a first multitude of gate sidewalls 16 projecting from the silicon wafer 12, and a multitude of gate sidewall oxides 18 covers at least the gate sidewalls 16 within the DRAM array fabrication 14. A multitude of DRAM gate junctions 26 are disposed within the DRAM array fabrication 14 and comprise regions doped to a first depth 28 beneath the first silicon dioxide layer. Referring again to FIG. 1, a support logic device fabrication or fabrication area 20 is disposed on the wafer 12 adjacent the DRAM array fabrication area 14. An enlarged cross-sectional view taken along line 3—3 of FIG. 1 is presented in FIG. 3. As shown in FIG. 3, the logic support device fabrication 20 comprises a second multitude of gate sidewalls 22 projecting from the silicon wafer 12, and a second multitude of gate sidewall oxides 24 covers at least the sidewalls 22 within the logic support device fabrication 20. According to an aspect of the invention, the first multitude of gate sidewall oxides 18 is substantially thicker than the second multitude of gate sidewall oxides 24. A multitude of support logic device junctions 30 are disposed within the logic support device fabrication 20 and comprise regions doped to a second depth 32. The first depth 28 may be greater than, equal to, or less than the second depth 32, but both are preferably relatively shallow. As used herein, the term fabrication is intended to refer to a structure that is in process, and not necessarily the finished structure. The oxidation in the DRAM array is preferably extensive, and may result in bird's beak silicon dioxide structures on the sidewalls at one or more interlayer surfaces of the gates 34.

The wafer 12 shown in FIG. 1 is just a portion of a full silicon wafer, and may correspond to the area actually occupied by a single integrated circuit (or "chip"). The silicon dioxide layer 18 is substantially thicker than the silicon dioxide layer 24 so that the silicon dioxide layer 18 is thick enough to improve array retention time by reducing electric fields. A heat treatment process employed to create a thicker silicon dioxide layer also tends to act as a stress relief anneal. A thicker silicon dioxide layer also helps to ameliorate defect densities. A thicker silicon dioxide layer, however, tends to require increased energy implants during junction doping and hence deeper junctions, which may be undesirable in areas outside the DRAM fabrication area. Providing a substantially thinner silicon dioxide layer in an adjacent support logical device fabrication area allows lower energy doping. The support logic device junctions 30 may be doped with a larger dose than the DRAM junctions thereby providing a substantially lower device series resistance. Thus, individual device performance may be improved and/or optimized as may be individually desired for particular types of devices and/or locations on the wafer 12. As used herein, the term "substantially" is intended to mean a magnitude of difference sufficient to achieve such effects.

The DRAM array fabrication 14 typically comprises a multitude of DRAM gate structures 34 formed by masking and deposition processes well known in the art. The sidewalls 16 are integrally formed as part of the DRAM gate structures 34. Each gate 34 may be provided with an overlying dielectric or masking layer 36 at one or more points in the process, which may be removed in subsequent processing. Other layers, including electrically insulative or conductive layers, may be grown or deposited as desired. In like manner the support logic device fabrication 20 typically comprises a multitude of logic device gate structures 38, also formed by masking and deposition processes well known in the art, and each gate 38 may be provided with an overlying dielectric or masking layer 40 at one or more points in the process, which may be removed in subsequent processing. Other layers, including electrically insulative or conductive layers, may be grown or deposited as desired. The sidewalls 22 are integrally formed as part of the support logic device gate structures 38. The gate structures 34 and 38 comprise one or more layers of doped or undoped polycrystalline silicon. as is well known in the art, and may be formed by a variety of known processes. One or more layers of silicide or other high conductivity material may be provided, as need for the particular design. The dielectric or masking layers 36 and 40 are typically comprised of silicon nitride, or silicon nitride formed over a layer of silicon dioxide, but other materials may be employed according to the particular need at hand.

Still referring to FIGS. 2 and 3, an IC fabrication 10 method is also provided according to a further aspect of the invention, including the steps of forming a DRAM array fabrication 14 on a silicon wafer 12 having a first multitude of gate sidewall oxides 18; and, forming a support logic device fabrication 20 on a silicon wafer 12 having a second multitude of gate sidewall oxides 24, the first multitude of gate sidewall oxides 18 being substantially thicker than the second multitude of gate sidewall oxides 24. The first multitude of gate sidewall oxides 18 may be 80% Å to 250 Å thick silicon dioxide, and the second multitude of gate sidewall oxides 24 may be 40 Å to 80 Å thick silicon dioxide.

Referring now to FIGS. 1 and 4–11, an IC fabrication process is presented according a further aspect of the invention, including the steps of forming a DRAM array fabrication 14 on a silicon wafer 12 having a first multitude of gate sidewall oxides 18 and a logic support device fabrication 20 having a second multitude of gate sidewall oxides 24 adjacent to said DRAM array fabrication 20; subsequently increasing thickness of said first multitude of gate sidewall oxides 18 so that they are substantially thicker than said second multitude of gate sidewall oxides 24; and, subsequently doping said logic support device fabrication 20.

Figure 4:
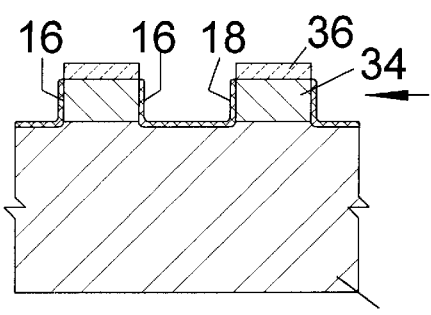
FIG. 4 presents an enlarged cross-sectional view of a DRAM array fabrication at an initial stage of a process according to an aspect of the invention.
Figure 5:
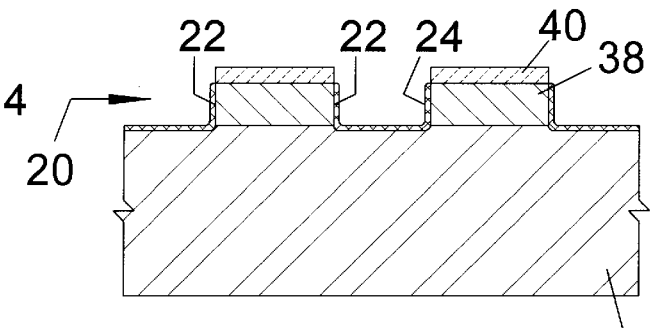
FIG. 5 presents an enlarged cross-sectional view of a logic support device fabrication at an initial stage of a process according to an aspect of the invention, that is adjacent to the FIG. 4 DRAM array fabrication on the same wafer.
Figure 6:
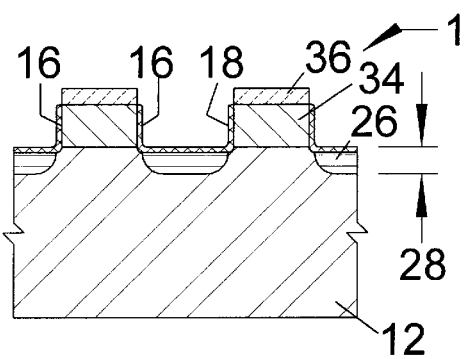
FIG. 6 presents an enlarged cross-sectional view of the FIG. 4 DRAM array fabrication at a later stage of the process.
Figure 7:
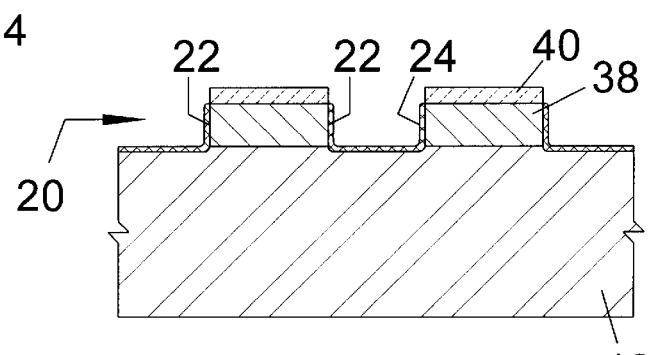
FIG. 7 presents an enlarged cross-sectional view of the FIG. 5 logic support device fabrication at a later stage of the process.
Figure 8:
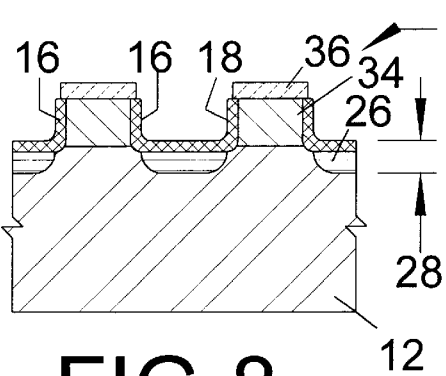
FIG. 8 presents an enlarged cross-sectional view of the FIG. 4 DRAM array fabrication at a still later stage of the process.
Figure 9:
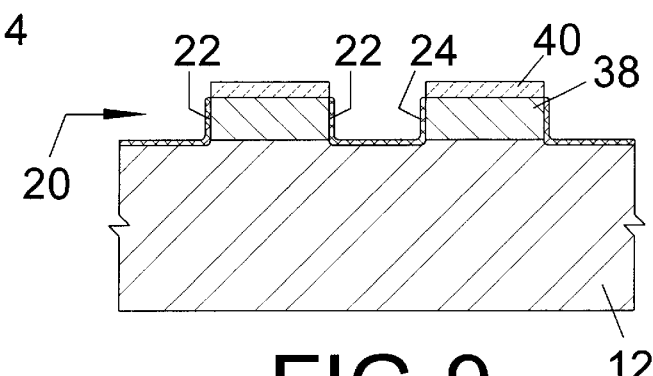
FIG. 9 presents an enlarged cross-sectional view of the FIG. 5 logic support device fabrication at a still later stage of the process.
Figure 10:
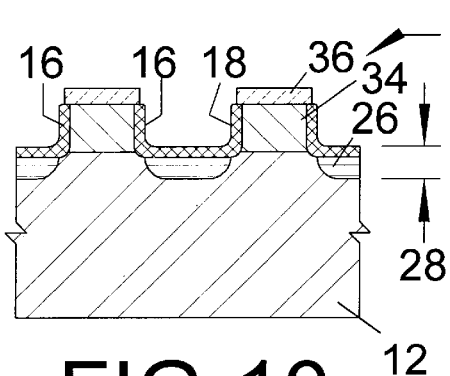
FIG. 10 presents an enlarged cross-sectional view of the FIG. 4 DRAM array fabrication at a final stage of the process suitable for further processing.
Figure 11:
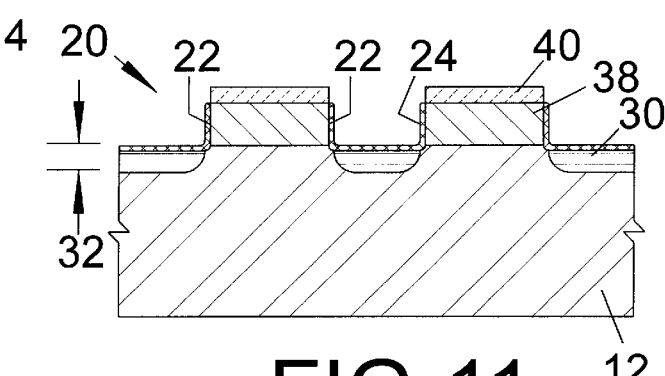
FIG. 11 presents an enlarged cross-sectional view of the FIG. 5 logic support device fabrication at a final stage of the process suitable for further processing.
Figure 12:
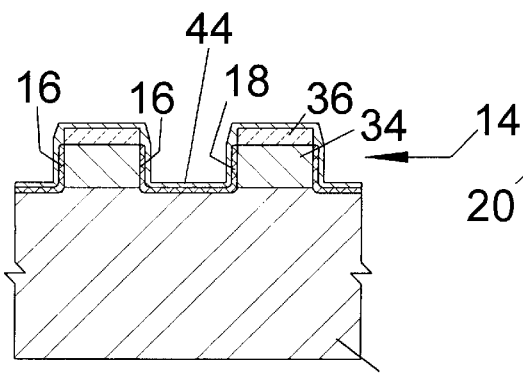
FIG. 12 presents an enlarged cross-sectional view of a DRAM array fabrication at an initial stage of a process according to a further aspect of the invention.
Figure 13:
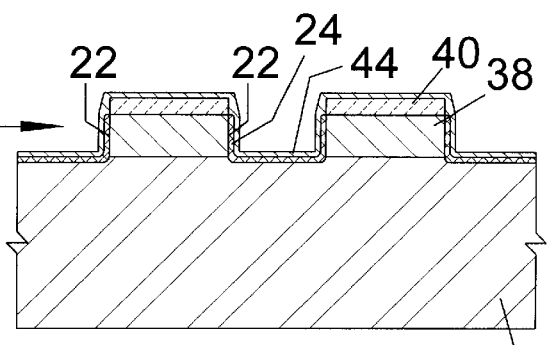
FIG. 13 presents an enlarged cross-sectional view of a logic support device fabrication at an initial stage of a process according to a further aspect of the invention, that is adjacent to the FIG. 12 DRAM array fabrication on the same wafer.
Figure 14:
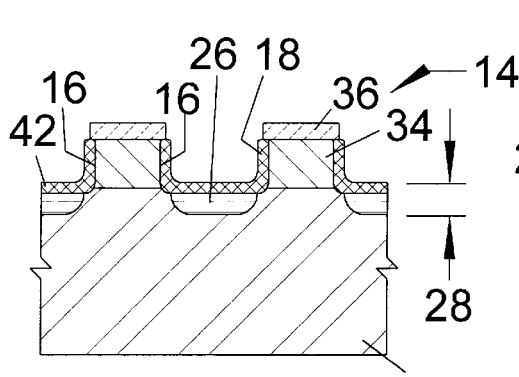
FIG. 14 presents an enlarged cross-sectional view of the FIG. 12 DRAM array fabrication at a later stage of the process.
Figure 15:
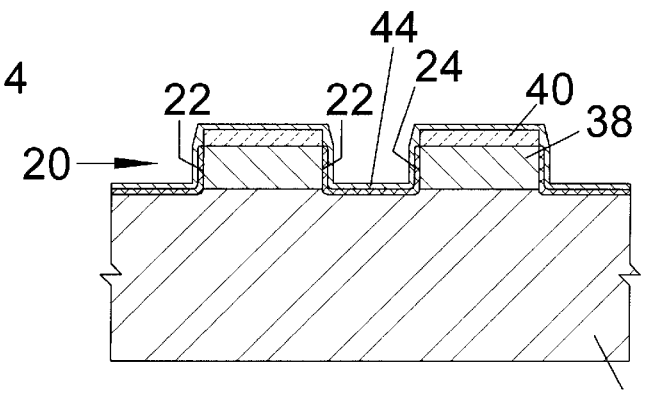
FIG. 15 presents an enlarged cross-sectional view of the FIG. 13 logic support device fabrication at a later stage of the process.

According to a preferred embodiment, the DRAM array fabrication 14 and the logic support device fabrication 20 are processed simultaneously. The first and second multitude of gate sidewall oxides 18 and 24 are initially formed at the same time (FIGS. 4 and 5). The first multitude of gate sidewall oxides 18 is then subjected to further oxidation while masking (with a material that withstands subsequent oxidation) the second multitude of gate sidewall oxides 24 (FIGS. 8 and 9), which substantially increases the thickness of the first multitude of gate sidewall oxides 18. The DRAM junctions 26 are then formed by doping the DRAM array fabrication 14, preferably while masking the adjacent support logic device fabrication 20 (FIGS. 6 and 7). In this step, the oxidation process may be tuned to create a silicon dioxide layer 18 that optimizes retention of the DRAM array. In the next step (FIGS. 10 and 11), the logic device junctions 30 are formed by doping the logic device fabrication 20, with or without masking the DRAM array fabrication 14. The dielectric layers 36 and 40 may be provided on top of each individual gate, as may be desired to mask individual gates throughout all or part of the process.

Figure 16:
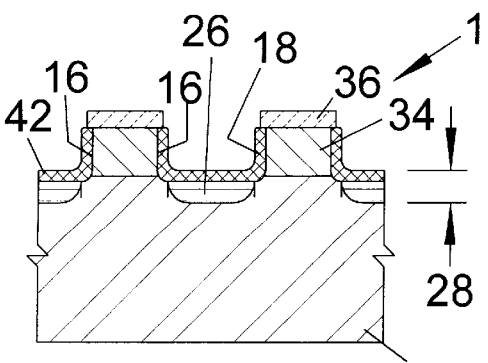
FIG. 16 presents an enlarged cross-sectional view of the FIG. 12 DRAM array fabrication at a final stage of the process suitable for further processing.
Figure 17:
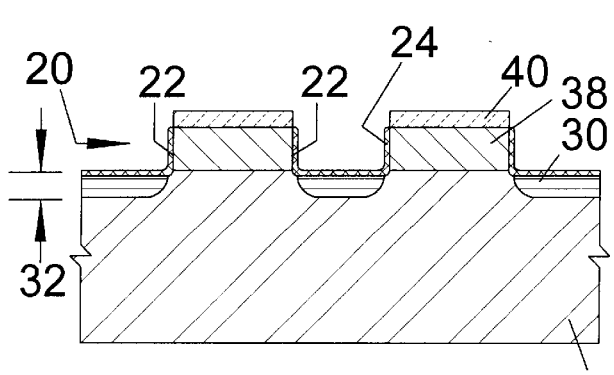
FIG. 17 presents an enlarged cross-sectional view of the FIG. 13 logic support device fabrication at a final stage of the process suitable for further processing.
Figure 18:
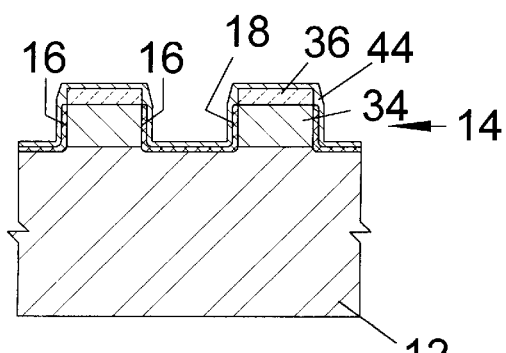
FIG. 18 presents an enlarged cross-sectional view of a DRAM array fabrication at an initial stage of a process according to a further aspect of the invention.
Figure 19:
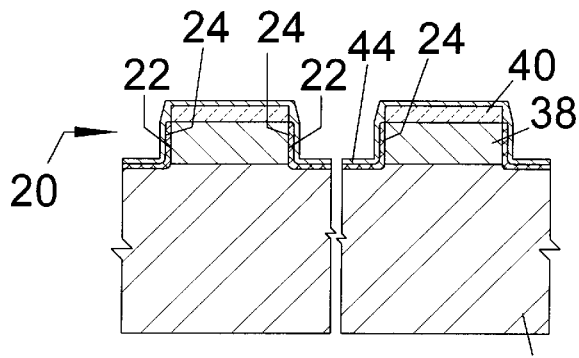
FIG. 19 presents an enlarged cross-sectional view of an adjacent logic support logic device fabrication at an initial stage of a process according to a further aspect of the invention, that is adjacent to the FIG. 18 DRAM array fabrication on the same wafer.
Figure 20:
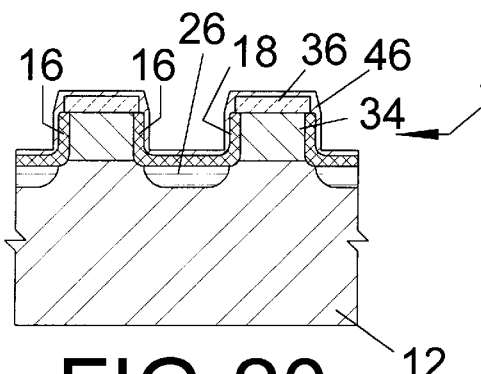
FIG. 20 presents an enlarged cross-sectional view of the FIG. 18 DRAM array fabrication at a later stage of the process.
Figure 21:
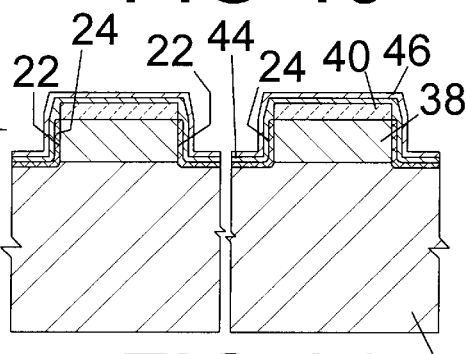
FIG. 21 presents an enlarged cross-sectional view of the FIG. 19 logic support device fabrication at a later stage of the process.
Figure 22:
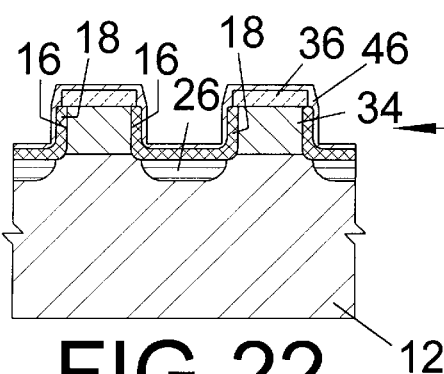
FIG. 22 presents an enlarged cross-sectional view of the FIG. 18 DRAM array fabrication at a still later stage of the process.
Figure 23:
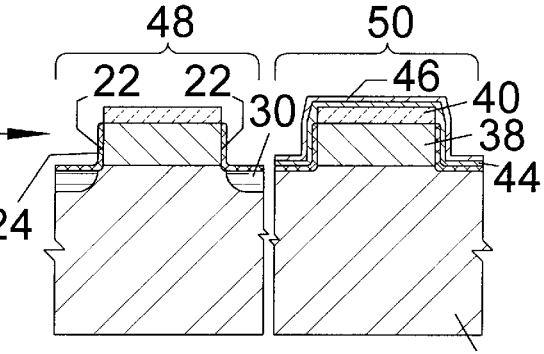
FIG. 23 presents an enlarged cross-sectional view of the FIG. 19 logic support device fabrication at a still later stage of the process.
Figure 24:
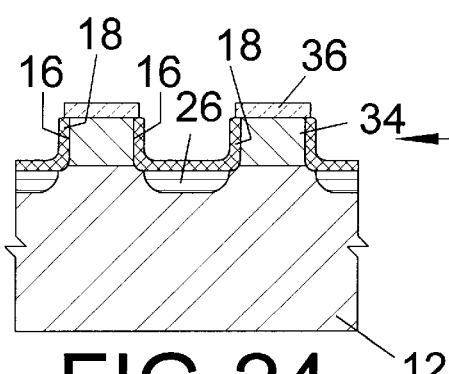
FIG. 24 presents an enlarged cross-sectional view of the FIG. 18 DRAM array fabrication at a final stage of the process suitable for further processing.

Referring now to FIGS. 1 and 12–17, an IC fabrication process is presented according to a further aspect of the invention, including the steps (preferably in order) of forming a DRAM array fabrication 14 area having a first multitude of gate sidewall oxides 18 on a silicon wafer 12 (FIG. 12); forming a support logic device fabrication area 20 including a second multitude of gate sidewall oxides 24 on a silicon wafer 12, the support logic device fabrication area 20 being adjacent the DRAM array fabrication 14 area (FIG. 13); forming a silicon nitride layer 44 over the first and second multitudes of gate sidewall oxides (FIGS. 12 and 13); removing the silicon nitride layer 44 from the first multitude of gate sidewall oxides 18 by a chemical downstream isotropic Etch (CDE) and leaving a remaining silicon nitride layer 44 over the second multitude of gate sidewall oxides 24 (FIG. 14); increasing thickness of the first multitude of gate sidewall oxides 18, the silicon nitride layer 44 shielding the second multitude of gate sidewall oxides 24 (FIG. 14); doping the DRAM array fabrication 14 area, the silicon nitride layer 44 shielding the second multitude of gate sidewall oxides 24 (FIGS. 14 and 15); removing the remaining silicon nitride layer 44 (FIGS. 16 and 17); and, doping the support logic device fabrication area 20 (FIGS. 16 and 17). According to a further aspect of the invention, the step of forming further silicon dioxide on the sidewalls within the DRAM fabrication optimizes DRAM retention, and the thickness of the gate sidewall oxidation may be as previously set forth in relation to FIGS. 4–11. The silicon nitride layer 44 may have a thickness from 30 Å to 300 Å.

Figure 25:
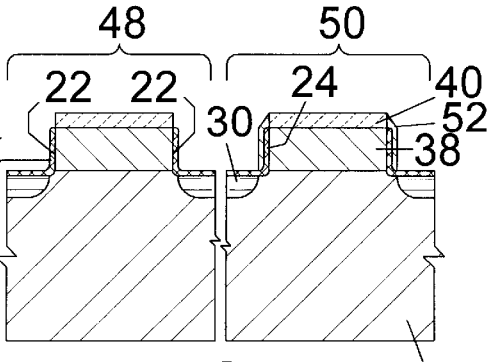
FIG. 25 presents an enlarged cross-sectional view of the FIG. 19 logic support device fabrication at a final stage of the process suitable for further processing.
Figure 26:
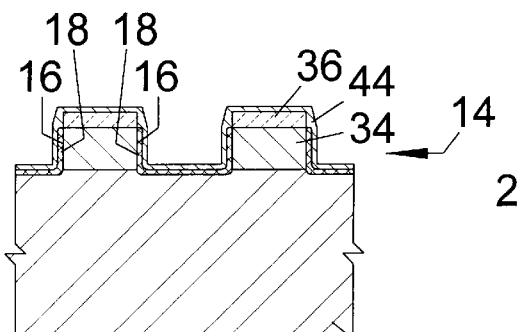
FIG. 26 presents an enlarged cross-sectional view of a DRAM array fabrication at an initial stage of a process according to a further aspect of the invention.
Figure 27:
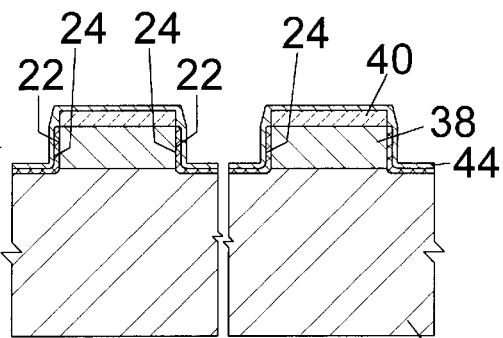
FIG. 27 presents an enlarged cross-sectional view ol an adjacent logic support device fabrication at an initial stage of a process according to a further aspect of the invention, that is adjacent to the FIG. 26 DRAM array fabrication on the same wafer.
Figure 28:
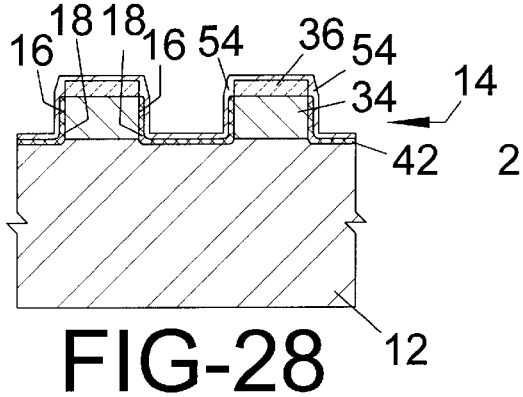
FIG. 28 presents an enlarged cross-sectional view of the FIG. 26 DRAM array fabrication at a later stage of the process.
Figure 29:
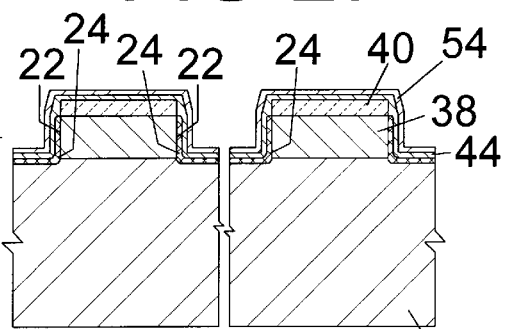
FIG. 29 presents an enlarged cross-sectional view of the FIG. 27 logic support device fabrication at a later stage of the process.
Figure 30:
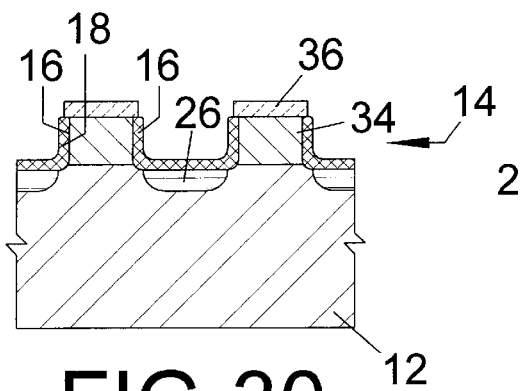
FIG. 30 presents an enlarged cross-sectional view of the FIG. 26 DRAM array fabrication at a still later stage of the process.
Figure 31:
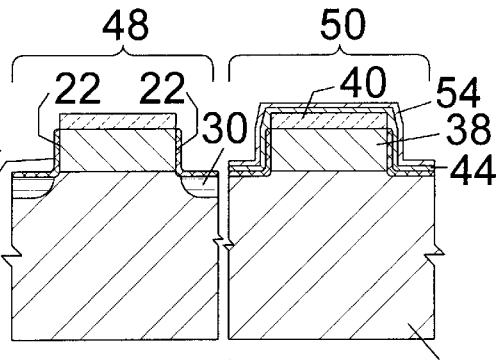
FIG. 31 presents an enlarged cross-sectional view of the FIG. 27 logic support device fabrication at a still later stage of the process.

Referring now to FIGS. 1 and 18–25, an IC fabrication process is presented according to a further aspect of the invention, including the steps (preferably in order) of forming a DRAM array fabrication 14 area having a first multitude of gate sidewall oxides 18 on a silicon wafer 12 (FIG. 18); forming a support logic device fabrication area 20 including a second multitude of gate sidewall oxides 24 on a silicon wafer 12, the support logic device fabrication area 20 being adjacent the DRAM array fabrication 14 area (FIG. 19); forming a silicon nitride layer 44 over the first and second multitude of gate sidewall oxides 24 (FIGS. 18 and 19); removing the silicon nitride layer 44 by an isotropic CDE Etch selective to underlying oxide, ROM the first multitude of gate sidewall oxides 18 and leaving a remaining silicon nitride layer 44 over the second multitude of gate sidewall oxides 24 (FIGS. 20 and 21); increasing thickness of the first multitude of gate sidewall oxides 18, the silicon nitride layer 44 shielding the second multitude of gate sidewall oxides 24 (FIGS. 20 and 21); doping the DRAM fabrication area 14, the silicon nitride layer 44 shielding the second multitude of gate sidewall oxides 24 (FIGS. 20 and 21); forming a sacrificial protective layer 46 over the DRAM array fabrication area 14 and the support logic device fabrication area 20 (FIGS. 20 and 21); removing the sacrificial protective layer 46 (by a HF based net etch or vapor) over at least a first portion 48 of the support logic device fabrication area 20 thereby exposing the silicon nitride layer 44 within the first portion 48 and leaving the sacrificial protective layer 46 over a remaining portion 50 of the support logic device fabrication 20 and the DRAM array fabrication 14 (FIGS. 22 and 23); removing exposed silicon nitride layer 44 within the first portion 48 (FIG. 23); doping the first portion 48, the sacrificial protective layer 46 shielding the DRAM array fabrication 14 area, the silicon nitride and the sacrificial protective layer 46 together shielding the remaining) portion 50 of the support logic device fabrication area 20 (FIGS. 22 and 23); removing the sacrificial protective layer 46 within the remaining portion 50 of the logical support fabrication area and over the DRAM array fabrication 14 area (FIGS. 24 and 25); reducing the remaining silicon nitride layer 44 within the remaining portion 50 of the logic support fabrication area to silicon nitride spacers 52 overlying the multitude of gate sidewall oxides 22 within the remaining portion 50 (FIG. 25); and, doping the remaining portion 50 of the logical support fabrication area (FIG. 25).

The remaining silicon nitride layer 44 is reduced to the silicon nitride spacers using an anisotropic etching process, preferably reactive ion etching. According to a certain embodiment of this process, the logical support array fabrication 20 comprises NFET (n-type Field Effect Transistor) fabrications within the first portion 48 and PFET (p-type Field Effect Transistor) fabrications within the remaining portion 50. The sacrificial protective layer is chosen from the group consisting of Boro-Silicate Glass (BSG), Arsenic Silicate Glass (ASG), Boro-Phospho Silicate Glass (BPSG), Phospho Silicate Glass (PSG) and fluorinated Boro Phospho Silicate Glass (FBPSG) and may have a thickness in the range of 10 nm to 70 nm. According to a further aspect of the invention, the step of increasing thickness of the first multitude of gate sidewall oxides 18 within the DRAM fabrication optimizes DRAM retention, and the thickness of the gate sidewall oxidation may be as previously set forth in relation to FIGS. 4–11. The silicon nitride layer 44 may have a thickness as previously set forth in relation to FIGS. 12–17.

Figure 32:
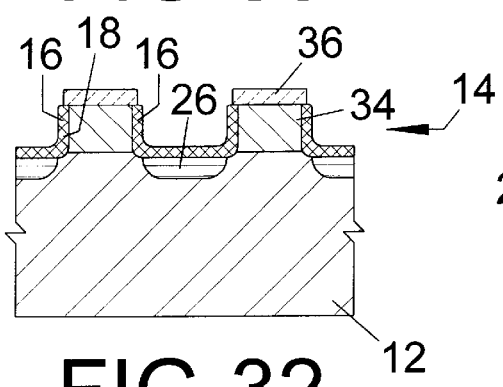
FIG. 32 presents an enlarged cross-sectional view of the FIG. 26 DRAM array fabrication at a final stage of the process suitable for further processing.
Figure 33:
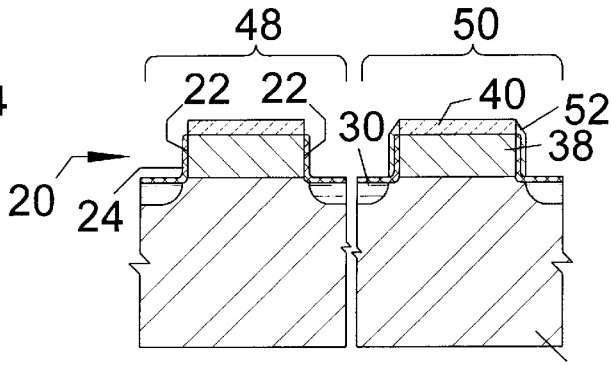
FIG. 33 presents an enlarged cross-sectional view of the FIG. 27 logic support device fabrication at a final stage of the process suitable for further processing.

Referring now to FIGS. 1 and 26–33, an IC fabrication process is presented according to a further aspect of the invention, including the steps (preferably in order) of forming a DRAM array fabrication area 14 having a first multitude of gate sidewall oxides 18 on a silicon wafer 12 (FIG. 26); forming a support logic device fabrication area 20 including a second multitude of gate sidewall oxides 24 on a silicon wafer 12, the support logic device fabrication area 20 being adjacent the DRAM array fabrication 14 area (FIG. 27); forming a silicon nitride layer 44 over the first and second multitude of gate sidewall oxides 24 (FIGS. 26 and 27); removing the silicon nitride layer 44 from the DRAM array fabrication 14 area and by a CDE isotropic etch leaving a remaining silicon nitride layer 44 over the support logic device fabrication 20 area (FIGS. 28 and 29); forming a layer of n-type doped glass 54 over the DRAM array fabrication 14 area and the support logic device area (FIGS. 28 and 29); driving n-type atoms from the n-type doped glass into the DRAM fabrication area while oxidizing the sidewall 16 within the DRAM fabrication area to increase thickness of the first multitude of gate sidewall oxides 18, the silicon nitride layer 44 shielding the support logic device fabrication 20 area (FIGS. 30 and 31); removing the n-type doped glass (by a HF based net etch or vapor) over at least a first portion 48 of the support logic device fabrication 20 area thereby exposing the silicon nitride layer 44 within the first portion 48 and leaving the sacrificial protective layer 46 over a remaining portion 50 of the support logic device fabrication 20 area and over the DRAM fabrication area (FIG. 31); removing exposed silicon nitride layer 44 by an isotropic CDE etch (FIG. 31); doping the first portion 48 of the support logic device fabrication area 20, the silicon nitride layer 44 and the n-type doped glass layer together shielding the multitude of gate sidewall oxides 22 within the remaining portion 50 of the support logic device fabrication 20 area, the n-type doped glass shielding the DRAM array fabrication 14 area (FIG. 31); removing the n-type doped glass left over the remaining portion 50 of the support logic device fabrication 20 area (by a HF based net etch or vapor) (FIG. 32); reducing the remaining silicon nitride layer 44 within the remaining portion 50 of the logic support fabrication area to silicon nitride spacers 52 overlying the multitude of gate sidewall oxides 22 within the remaining portion 50 (FIG. 32); and, doping the remaining portion 50 of the support logic device fabrication 20 area (FIG. 32). According to a further aspect of the invention, the step of increasing thickness of the first multitude of gate sidewall oxides 18 within the DRAM fabrication optimizes DRAM retention, and the thickness of the gate sidewall oxidation may be as previously set forth in relation to FIGS. 4–11. The silicon nitride layer 44 may have a thickness as previously set forth in relation to FIGS. 12–17. The n-type doped glass may have a thickness in the range of 50 Å to 700 Å, and would generally be ASG or PSG.

Products made by the processes described herein also constitute an aspect of the invention.

Although the invention has been described and illustrated with reference to specific illustrative embodiments thereof, it is not intended that the invention be limited to those illustrative embodiments. Those skilled in the art will recognize that variations and modifications can be made without departing from the true scope and spirit of the invention as defined by the claims that follow. It is therefore intended to include within the invention all such variations and modifications as fall within the scope of the appended claims and equivalents thereof.

We claim:

1. An IC fabrication method, comprising the steps of:
   forming a DRAM array fabrication on a silicon wafer having a first multitude of gate sidewall oxides; and,
   forming a logic support device fabrication on a silicon wafer having a second multitude of gate sidewall oxides, said first multitude of gate sidewall oxides being substantially thicker than said second multitude of gate sidewall oxides.

2. An IC fabrication method, comprising the steps of:
   forming a DRAM array fabrication on a silicon wafer having a first multitude of gate sidewall oxides and a logic support device fabrication having a second multitude of gate sidewall oxides adjacent to said DRAM array fabrication;
   subsequently doping said DRAM array fabrication;
   subsequently increasing thickness of said first multitude of gate sidewall oxides so that they are substantially thicker than said second multitude of gate sidewall oxides; and,
   subsequently doping said logic support device fabrication.

3. The process of claim 2, wherein said logic support device fabrication is doped to a greater degree than said DRAM array fabrication.

4. The process of claim 2, wherein said step of increasing thickness of said first multitude of gate sidewall oxides optimizes DRAM retention.An IC fabrication process, comprising the steps of:
   forming a DRAM array fabrication area having a first multitude of gate sidewall oxides on a silicon wafer;
   forming a logic support device fabrication area including a second multitude of gate sidewall oxides on a silicon wafer, said logic support device fabrication area being adjacent said DRAM array fabrication area;
   forming a silicon nitride layer over said first and second multitudes of gate sidewall oxides;
   removing said silicon nitride layer from said first multitude of gate sidewall oxides and leaving a remaining silicon nitride layer over said second multitude of gate sidewall oxides;
   increasing thickness of said first multitude of gate sidewall oxides, said silicon nitride layer shielding said second multitude of gate sidewall oxides;
   doping said DRAM array fabrication area, said silicon nitride layer shielding said second multitude of gate sidewall oxides;
   removing said remaining silicon nitride layer; and,
   doping said logic support device fabrication area.

5. The process of claim 4, wherein said logic support device fabrication is doped to a greater degree than said DRAM array fabrication.

6. The process of claim 4, wherein said step of forming further silicon dioxide on said sidewalls within said DRAM fabrication optimizes DRAM retention.

7. An IC fabrication process, comprising the steps of:
   forming a DRAM array fabrication area having a first multitude of gate sidewall oxides on a silicon wafer;
   forming a logic support device fabrication area including a second multitude of gate sidewall oxides on a silicon wafer, said logic support device fabrication area being adjacent said DRAM array fabrication area;

forming a silicon nitride layer over said first and second multitude of gate sidewall oxides;

removing said silicon nitride layer from said first multitude of gate sidewall oxides and leaving a remaining silicon nitride layer over said second multitude of gate sidewall oxides;

increasing thickness of said first multitude of gate sidewall oxides, said silicon nitride layer shielding said second multitude of gate sidewall oxides;

doping said DRAM fabrication area, said silicon nitride layer shielding said second multitude of gate sidewall oxides;

forming a sacrificial protective layer over said DRAM array fabrication area and said logic support device fabrication area;

removing said sacrificial protective layer over at least a first portion of said said logic support device fabrication area thereby exposing said silicon nitride layer within said first portion and leaving said sacrificial protective layer over a remaining portion of said logic support device fabrication and said DRAM array fabrication;

removing exposed silicon nitride layer within said first portion;

doping said first portion, said sacrificial protective layer shielding said DRAM array fabrication area, said silicon nitride and said sacrificial protective layer together shielding said remaining portion of said logic support device fabrication area;

removing said sacrificial protective layer within said remaining portion of said logical support fabrication area and over said DRAM array fabrication area;

reducing said remaining silicon nitride layer within said remaining portion of said logical support fabrication area to silicon nitride spacers overlying said multitude of gate sidewall oxides within said remaining portion; and, doping said remaining portion of said logical support fabrication area.

8. The process of claim 7, wherein said logic support device fabrication comprises NFET fabrications within said first portion and PFET fabrications within said remaining portion.

9. The process of claim 7, wherein said step of forming further silicon dioxide on said sidewalls within said DRAM fabrication optimizes DRAM retention.

10. The process of claim 7, wherein said sacrificial protective layer is chosen from the group consisting of boron silicate glass and arsenic silicate glass.

11. An IC fabrication process, comprising the steps of:

forming a DRAM array fabrication area having a first multitude of gate sidewall oxides on a silicon wafer;

forming a logic support device fabrication area including a second multitude of gate sidewall oxides on a silicon wafer, said logic support device fabrication area being adjacent said DRAM array fabrication area;

forming a silicon nitride layer over said first and second multitude of gate sidewall oxides;

removing said silicon nitride layer from said DRAM array fabrication area and leaving a remaining silicon nitride layer over said support logic device fabrication area;

forming a layer of n-type doped glass over said DRAM array fabrication area and said logic support device area;

driving n-type atoms from said n-type doped glass into said DRAM fabrication area while oxidizing said layer of n-type doped glass within said DRAM fabrication area to increase thickness of said first multitude of gate sidewall oxides, said silicon nitride layer shielding said support logic device fabrication area;

removing said n-type doped glass over at least a first portion of said support logic device fabrication area thereby exposing said silicon nitride layer within said first portion and leaving said sacrificial protective layer over a remaining portion of said support logic device fabrication area and over said DRAM fabrication area;

removing exposed silicon nitride layer;

doping said first portion of said logic support device fabrication area, said silicon nitride layer and said n-type doped glass layer together shielding said multitude of gate sidewall oxides within said remaining portion of said support logic device fabrication area, said n-type doped glass shielding said DRAM array fabrication area;

removing said n-type doped glass left over said remaining portion of said support logic device fabrication area;

reducing said remaining silicon nitride layer within said remaining portion of said logical support fabrication area to silicon nitride spacers overlying said multitude of gate sidewall oxides within said remaining portion; and, doping said remaining portion of said support logic device fabrication area.

12. The process of claim 11, wherein said logic support device fabrication comprises NFET fabrications within said first portion and PFET fabrications within said remaining portion.

* * * * *